(12) United States Patent
Shi et al.

(10) Patent No.: US 12,557,494 B2
(45) Date of Patent: Feb. 17, 2026

(54) DISPLAY APPARATUS

(71) Applicants: Chengdu BOE Optoelectronics Technology Co., Ltd., Sichuan (CN); BOE TECHNOLOGY GROUP CO., LTD., Beijing (CN)

(72) Inventors: Bo Shi, Beijing (CN); Chi Yu, Beijing (CN); Yuanming Feng, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 610 days.

(21) Appl. No.: 17/921,405

(22) PCT Filed: Jun. 9, 2021

(86) PCT No.: PCT/CN2021/099192
§ 371 (c)(1),
(2) Date: Oct. 26, 2022

(87) PCT Pub. No.: WO2022/022091
PCT Pub. Date: Feb. 3, 2022

(65) Prior Publication Data
US 2023/0165109 A1  May 25, 2023

(30) Foreign Application Priority Data
Jul. 31, 2020  (CN) .......................... 202010761054.5

(51) Int. Cl.
*H10K 59/80* (2023.01)
*H10K 59/131* (2023.01)
*H10K 59/65* (2023.01)

(52) U.S. Cl.
CPC ....... *H10K 59/131* (2023.02); *H10K 59/8791* (2023.02); *H10K 59/8793* (2023.02); *H10K 59/65* (2023.02); *H10K 59/879* (2023.02)

(58) Field of Classification Search
CPC ............ H10K 59/131; H10K 59/8791; H10K 59/8793; H10K 59/65; H10K 59/879; G02B 1/04; G02B 5/30; G02B 5/3083
See application file for complete search history.

(56) References Cited

U.S. PATENT DOCUMENTS

2014/0192277 A1* 7/2014 Yilmaz ................. G06F 3/0446
349/12
2014/0334001 A1* 11/2014 Oh ....................... G02B 5/3083
156/182
(Continued)

FOREIGN PATENT DOCUMENTS

CN         107533178 A    1/2018
CN         110208957 A    9/2019
(Continued)

OTHER PUBLICATIONS

English Machine Translation of Yue, WO 2020215879 (Year: 2025).*
(Continued)

*Primary Examiner* — Donald L Raleigh
(74) *Attorney, Agent, or Firm* — HOUTTEMAN LAW LLC

(57) ABSTRACT

The present disclosure provides a display apparatus. According to the present disclosure, a complex refractive layer is disposed on a side of the polarizer facing away from the electroluminescent display panel, and configured to convert the linearly polarized light into the circularly polarized light, so that the linearly polarized light in different polarization states having passed through the glass enters the complex refractive layer before entering the polarizer, the complex refractive layer converts the linearly polarized light into the
(Continued)

circularly polarized light, and when the included angle between the film-forming stretching direction of the complex refractive layer and the first direction is an acute angle, almost all of the circularly polarized light can pass through the polarizer, thus eliminating the Mura phenomenon.

19 Claims, 11 Drawing Sheets

(56) References Cited

U.S. PATENT DOCUMENTS

| | | | | |
|---|---|---|---|---|
| 2019/0027707 | A1* | 1/2019 | Yu | G02B 5/3025 |
| 2019/0305256 | A1* | 10/2019 | Wu | H01L 23/5387 |
| 2021/0029336 | A1* | 1/2021 | Liu | H04N 23/84 |
| 2022/0208897 | A1* | 6/2022 | Yue | H04N 23/57 |

FOREIGN PATENT DOCUMENTS

| | | | | |
|---|---|---|---|---|
| CN | 110908164 | A | 3/2020 | |
| CN | 111292628 | A | 6/2020 | |
| CN | 111292877 | A | 6/2020 | |
| CN | 213878096 | A | 8/2021 | |
| JP | 2006163169 | A | 6/2006 | |
| WO | WO-2020215879 | A1 * | 10/2020 | G09F 9/33 |

OTHER PUBLICATIONS

China Patent Office, First Office Action dated Oct. 28, 2024, for corresponding Chinese application 202010761054.5.
China Patent Office, First Office Action issued Mar. 15, 2021 for application No. CN202021564163.X.
China Patent Office, Second Office Action, Mar. 10, 2025, for corresponding CN application No. 202010761054.5.
Sun, Feng-jiu, "Fundamentals of Applied Optoelectronic Technology," Dec. 31, 2015, pp. 64-65 pub. by Northeastern University, Shenyang, CN.

* cited by examiner

DISPLAY APPARATUS

CROSS-REFERENCE TO RELATED APPLICATIONS

This is a National Phase Application filed under 35 U.S.C. 371 as a national stage of PCT/CN2021/099192, fled on Jun. 9, 2021 an application claiming the priority of the Chinese Patent Application No. 202010761054.5 filed to the CNIPA on Jul. 31, 2020, entitled "display apparatus", the content of which is incorporated herein by reference in its entirety.

TECHNICAL FIELD

The present disclosure relates to the field of display technology, in particular to a display apparatus.

BACKGROUND

Currently, a full screen is a main direction of a development of the organic light-emitting diode (OLED) display technology. A scheme capable of realizing real full screen display is that the display can be carried out in a shooting area, namely, a camera-under-screen scheme.

SUMMARY

An embodiment of the present disclosure provides a display apparatus, including: an electroluminescent display panel having a display area; wherein the display area includes a light-transmitting area; the electroluminescent display panel includes a gate line extending along a first direction and a data line extending along a second direction; a camera on a back side of the electroluminescent display panel, wherein an orthographic projection of the camera on the electroluminescent display panel is in the light-transmitting area; a polarizer on a light outgoing side of the electroluminescent display panel; and a complex refractive layer on a side of the polarizer facing away from the electroluminescent display panel; wherein the complex refractive layer is configured to convert linearly polarized light into circularly polarized light; and an included angle between a film-forming stretching direction of the complex refractive layer and the first direction is an acute angle.

In the above display apparatus provided by the embodiment of the present disclosure, the acute angle is in a range from 20° to 60°.

In the above display apparatus provided by the embodiment of the present disclosure, an included angle between an extending direction of a light transmission axis of the polarizer and the first direction is in a range from 0° to 180°.

In the above display apparatus provided by the embodiment of the present disclosure, an included angle between the film-forming stretching direction of the complex refractive layer and an extending direction of a light transmission axis of the polarizer is in a range from 0° to 160°.

In the above display apparatus provided by the embodiment of the present disclosure, the acute angle is 45°.

In the above display apparatus provided by the embodiment of the present disclosure, a phase difference value of the complex refractive layer is in a range from 1000 to 20000.

In the above display apparatus provided by the embodiment of the present disclosure, the phase difference value of the complex refractive layer is 5000.

In the above display apparatus provided by the embodiment of the present disclosure, a material of the complex refractive layer is a polyethylene terephthalate or a super retarder film.

In the above display apparatus provided by the embodiment of the present disclosure, a material of the complex refractive layer is a polyethylene terephthalate; and a thickness of the complex refractive layer is in a range from 30 µm to 200 µm.

In the above display apparatus provided by the embodiment of the present disclosure, the thickness of the complex refractive layer is 50 µm.

In the above display apparatus provided by the embodiment of the present disclosure, the complex refractive layer is arranged in a whole surface.

In the above display apparatus provided by the embodiment of the present disclosure, the complex refractive layer and the polarizer are bonded together by a pressure-sensitive adhesive or an optical adhesive.

The display apparatus provided by the embodiment of the present disclosure further includes a cover plate on a side of the complex refractive layer facing away from the electroluminescent display panel.

In the above display apparatus provided by the embodiment of the present disclosure, the complex refractive layer is also used as a cover plate of the display apparatus.

In the above display apparatus provided by the embodiment of the present disclosure, a hardness value of the complex refractive layer is greater than or equal to 6H.

In the above display apparatus provided by the embodiment of the present disclosure, a hardness value of at least a portion of the complex refractive layer corresponding to the light-transmitting area is greater than or equal to 6H.

The display apparatus provided by the embodiment of the present disclosure further includes a touch functional layer between the electroluminescent display panel and the polarizer.

In the above display apparatus provided by the embodiment of the present disclosure, the electroluminescent display panel includes: a substrate; driving circuits on a side of the substrate facing the polarizer; light-emitting pixels on a side of the driving circuits facing the polarizer; and an encapsulation layer on a side of the light-emitting pixels facing the polarizer; and wherein a distribution density of the driving circuits in the light-transmitting area is less than a distribution density of the driving circuits in a non-light-transmitting area.

In the above display apparatus provided by the embodiment of the present disclosure, a distribution density of the light-emitting pixels in the light-transmitting area is equal to that of the light-emitting pixels in the non-light-transmitting area.

DETAIL DESCRIPTION OF EMBODIMENTS

Figure 1:
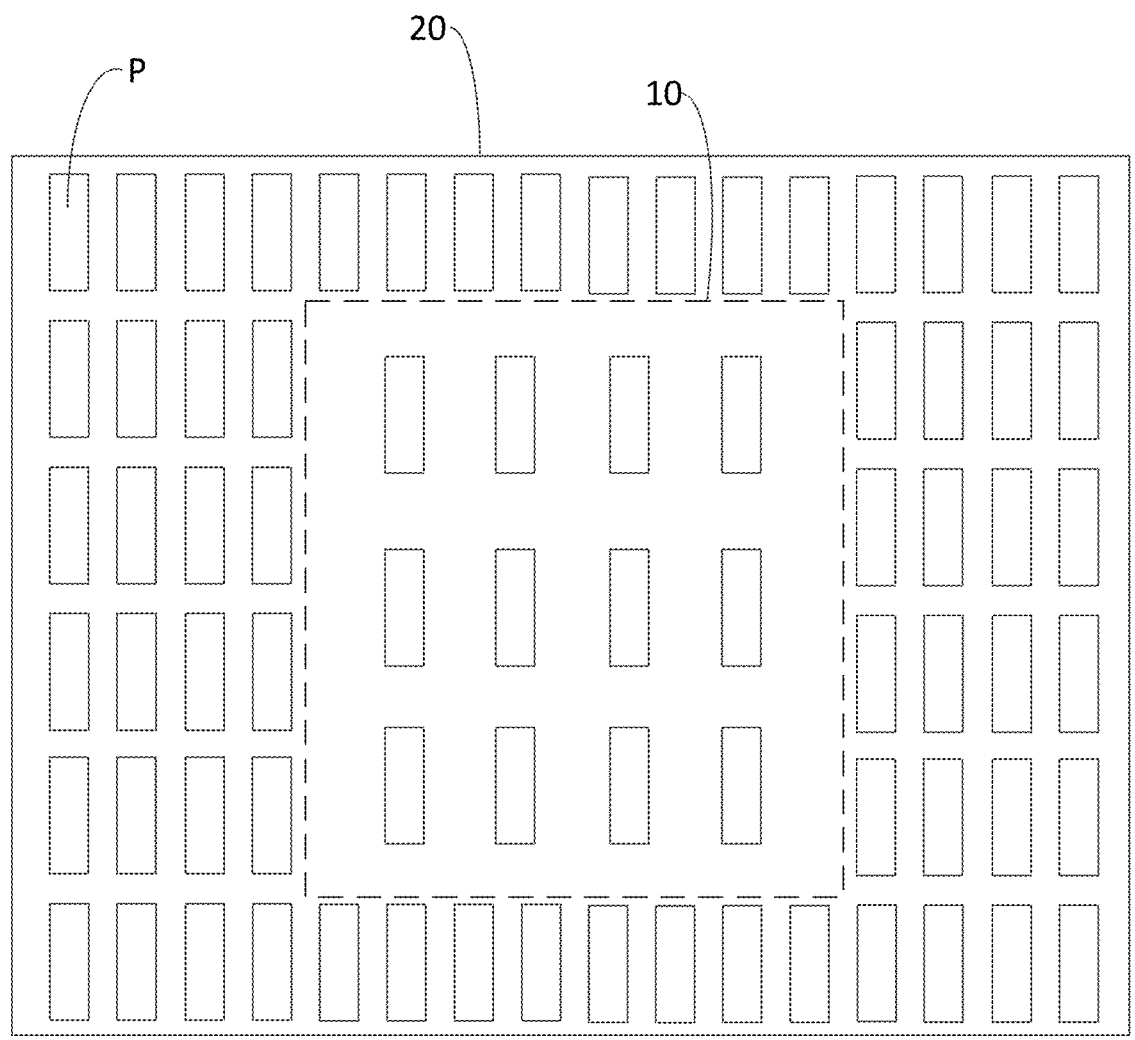
FIG. 1 is a schematic diagram of a distribution of pixels in a camera-under-screen display area and a normal display area of a camera-under-screen display apparatus.

In order to make the objects, technical solutions and advantages of the present disclosure more apparent, specific embodiments of a display apparatus according to an embodiment of the present disclosure are described in detail below with reference to the accompanying drawings.

Thicknesses and shapes of various layers in the drawings are not intended to reflect the actual scale of the display apparatus, but are merely illustrative of the present disclosure.

At present, most of full screen display apparatuses adopt a punching screen, namely, a display screen is punched in a shooting area, and a shooting device is arranged at the punching position, so that a shooting function can be only realized but a display function cannot be realized in the shooting area; it is required for a real full screen display apparatus to display an image in the shooting area.

In the present disclosure, by taking a full screen display apparatus based on an OLED display screen as an example, as shown in FIG. 1, an OLED display panel in the present disclosure has a camera-under-screen display area 10 and a normal display area 20 surrounding the camera-under-screen display area 10. In FIG. 1, P represents anodes corresponding to R, G, B sub-pixels respectively, and each anode corresponds to a driving circuit. FIG. 1 only schematically illustrates that the number of the driving circuits in the camera-under-screen display area 10 is less than that of the driving circuits in the normal display area 20, so as to implement light transmission in the camera-under-screen display area 10. In addition, in order to reduce or eliminate the influence of the ambient light on the visibility of the display panel and increase a contrast ratio, a polarizer needs to be provided in the display panel to counteract the ambient light.

When using the above full screen display apparatus, the inventors found that a stripe Mura (shown in FIG. 3) with uneven brightness appears in the shot picture when the camera-under-screen display apparatus shown in FIG. 1 is used to shoot a picture through a transparent structure such as a glass window.

After repeated research, the inventors of the present disclosure found the following.

In the display panel of the camera-under-screen scheme shown in FIG. 1, the polarizer is arranged in a whole surface, that is, the camera-under-screen display area 10 is also provided with the polarizer. In rainy days, the rainwater may wash an outdoor glass window (such as a window of a house). Dust exists on a surface of the outdoor glass window, and when rainwater strikes the glass window, traces are formed by the washing of rainwater on the glass window. That is, dust exists in some, not all, portions of the glass window, so in an environment with sunlight irradiation, when a user holds the camera-under-screen display apparatus to shoot outdoor scenes indoors through the glass window, outdoor natural light passes through the glass window to enter indoors and is refracted to form a linearly polarized light; after the glass window is washed by rainwater, some portions of the glass window are clean (i.e., without dust), but dust still exists in the other portions. Since refractive indexes of the glass window and dust are different, the linearly polarized light which is refracted through the different portions of the glass window and enters indoors has different polarization states. When the camera-under-screen display apparatus is used for shooting, the linearly polarized light in different polarization states enters the polarizer, and then, the linearly polarized light in some areas may be absorbed by the polarizer, which results in the uneven brightness in the image (Mura phenomenon).

Figure 2:
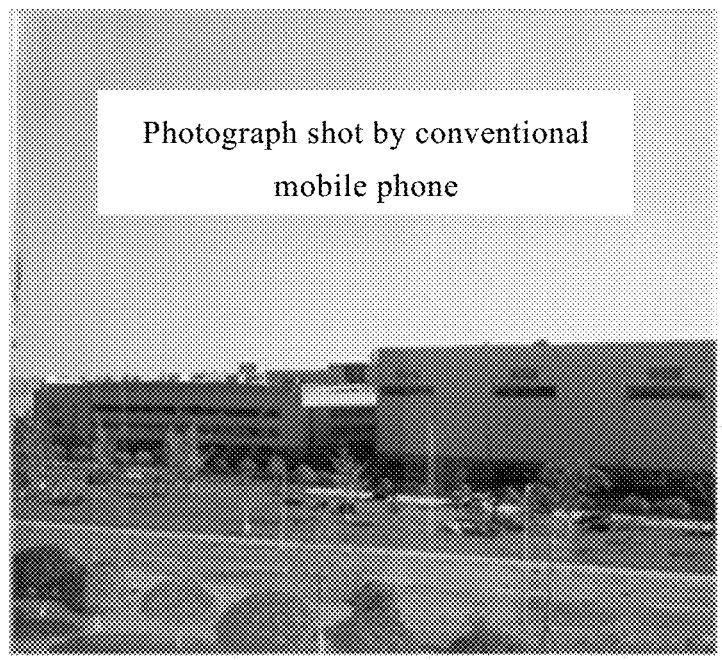
FIG. 2 is a photograph of an outdoor scene shot indoors by a conventional display product.
Figure 3:
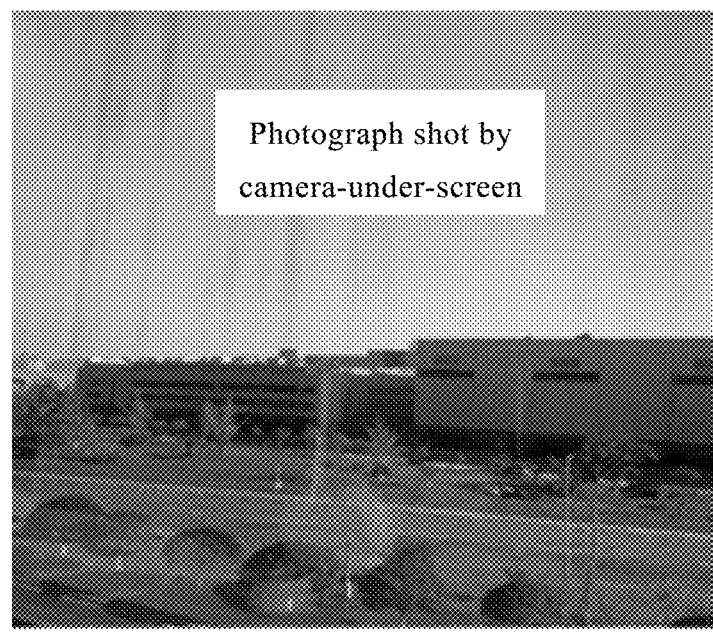
FIG. 3 is a photograph of an outdoor scene shot indoors by a camera-under-screen display product.

As shown in FIGS. 2 and 3, FIG. 2 is a photograph of an outdoor scene shot indoors by using a non-camera-under-screen display product (a conventional mobile phone) in a sunny environment after rainy weather. FIG. 3 is a photograph of an outdoor scene shot indoors by using the camera-under-screen display product (a camera-under-screen mobile phone) shown in FIG. 1 in a sunny environment after rainy weather. It can be seen that there is no obvious stripe with uneven brightness in the photograph of FIG. 2; and there are obvious stripes with uneven brightness in the photograph of FIG. 3. Specifically, the glass window may be a transparent structure on which a foreign matter is prone to be left, such as a car window. For example, a user may wipe a windshield of a vehicle with a wiper, and then traces may be left on the car window after the car window is wiped by the wiper, and the Mura phenomenon may also occur when an out-car scene is shot in-car. Alternatively, the glass window is not limited to the glass window of the house or the car window, and may be a transparent window used in other places capable of accommodating people.

In view of the above, the present disclosure provides a display apparatus, as shown in FIG. 4 to FIG. 7, including an electroluminescent display panel 100. The electroluminescent display panel 100 has a display area, and the display area has a light-transmitting area BB. Only the light-transmitting area BB is illustrated in FIG. 4 to FIG. 7, and the light-transmitting area BB corresponds to the camera-under-screen display area 10 in the display panel shown in FIG. 1; the electroluminescent display panel includes a gate line extending in a first direction and a data line extending in a second direction. In general, the first direction and the second direction may be perpendicular to each other; it should be noted that an extending direction of the gate line is generally a horizontal direction in a plane of the display panel, an extending direction of the data line is generally a vertical direction in the plane of the display panel. The first direction is the horizontal direction, and the second direction is the vertical direction in the embodiment of the present disclosure.

The display apparatus further includes a camera 200 on a back side of the electroluminescent display panel 100 and in the light-transmitting area BB. It should be noted that the back side of the electroluminescent display panel 100 is a side opposite to a light outgoing side of the electroluminescent display panel 100.

The display apparatus in the embodiment of the present disclosure further includes: a polarizer 300 located on the light outgoing side of the electroluminescent display panel 100, and a complex refractive layer 400 located on a side of the polarizer 300 facing away from the electroluminescent display panel 100.

The complex refractive layer 400 is configured to convert linearly polarized light into circularly polarized light, and an included angle between a film-forming stretching direction of the complex refractive layer 400 and the first direction (the horizontal direction) is an acute angle.

By taking the sunny environment after rainy weather as an example, when a user uses the display apparatus according to the embodiment of the present disclosure to shoot outdoor scenes through the glass (such as the window) indoors, dust exists on a surface of the outdoor glass window, so that when rainwater strikes the glass window, traces are formed by the washing of rainwater on the glass window. Since refractive indexes of the glass window and dust are different, outdoor natural light passes through the glass window to enter indoors and is refracted to form a linearly polarized light. After the glass window is washed by rainwater, some portions of the glass window are clean (i.e., without dust), but dust still exists in the other portions, so that the linearly polarized light which is refracted through the different portions of the glass window and enters indoors has different polarization states. If the linearly polarized light directly enters the polarizer at this time, the linearly polarized light in some areas may be absorbed by the polarizer, which results in the uneven brightness in the image (Mura phenomenon). According to the present disclosure, the complex refractive layer 400 is disposed on the side of the polarizer 300 facing away from the electroluminescent display panel 100, and configured to convert the linearly polarized light into the circularly polarized light, so that the linearly polarized light in the different polarization states enters the complex refractive layer 400 before entering the polarizer 300, the complex refractive layer 400 converts the linearly polarized light into the circularly polarized light, when the included angle between the film-forming stretching direction of the complex refractive layer 400 and the first direction is an acute angle, almost all of the circularly polarized light may pass through the polarizer 300, and then the Mura phenomenon disappears.

It should be noted that each trace of the dust formed by the washing of rainwater on the glass window extends substantially in the vertical direction, so that when the display apparatus is used in the vertical direction, the extending direction of each trace may be considered to be approximate to the second direction, and perpendicular to the first direction.

It should be noted that the display apparatus provided in the embodiment of the present disclosure is a camera-under-screen display apparatus, the light-transmitting area BB belongs to a part of the display area, that is, the light-transmitting area BB can also display, and a difference between the light-transmitting area BB and portions of the display area except the light-transmitting area BB is that the number of pixel circuits in the light-transmitting area BB is reduced to realize the light transmission. As shown in FIG. 1, the camera-under-screen display area 10 in FIG. 1 is the light-transmitting area BB in the embodiment of the present disclosure, and a display area formed by the camera-under-screen display area 10 and the normal display area 20 is equivalent to the display area in the embodiment of the present disclosure.

In a specific implementation, in the display apparatus provided in the embodiment of the present disclosure, as shown in FIGS. 4 to 7, the electroluminescent display panel 100 includes: a substrate 1, which may be a flexible substrate (e.g. PI); driving circuits 2 arranged on a side of the substrate 1 facing the polarizer 300 and including an active layer, a gate metal layer, a source drain metal layer and insulating layers, which are stacked together, each insulating layer being arranged between every two adjacent layers of the driving circuits 2; anodes 3 disposed on a side of the driving circuits 2 facing the polarizer 300, each anode 3 being electrically connected to a drain electrode of a corresponding driving thin film transistor (TFT) in the driving circuit 2 through a via penetrating through the insulating layers, and each of R, G, B sub-pixels corresponding to an anode (only schematically illustrated in the drawings); light-emitting layers (represented by reference signs R, G, B) disposed on a side of the anodes 3 facing the polarizer 300; cathodes (not shown) disposed on a side of the light-emitting layer facing the polarizer 300; and an encapsulation layer 4 disposed on a side of the cathode facing the polarizer 300. An anode 3, a light-emitting layer and a cathode constitute a light-emitting pixel.

Alternatively, the electroluminescent display panel 100 may also have other functional layers known to one of ordinary skill in the art. Specifically, the structure of the electroluminescent display panel 100 is the same as that of the related art, and is not described in detail here.

It should be noted that as shown in FIG. 4 to FIG. 7, R, G, B sub-pixels in the light-transmitting area BB are arranged in the same manner as R, G, B sub-pixels in the portions of the display area except the light-transmitting area BB, so that the manufacturing process can be simplified; and a difference between the arrangements of R, G, B sub-pixels in the light-transmitting area BB and in the portions of the display area except the light-transmitting area BB lies in that the number of driving circuits in the light-transmitting area BB is reduced. Sub-pixels are independently driven to emit light, the anodes corresponding to the sub-pixels are in one-to-one correspondence with and electrically connected to the drain electrodes of the driving circuits. Only some sub-pixels are electrically connected to the anodes 3, as shown in FIG. 4 to FIG. 7, so that no driving circuit is provided in an area below the sub-pixels where no anode 3 is provided, thereby realizing the light transmission and the camera-under-screen.

It should be noted that as shown in FIGS. 4 to 7, the R, G, B sub-pixels are electrically connected to different anodes, respectively. A case is only schematically illustrated in FIGS. 4 to 7 where the light-transmitting area BB includes an area where no driving circuit is provided and no anode is provided.

It should be noted that in the display apparatus provided in the embodiment of the present disclosure, a pixel density of the light-transmitting area is the same as that of the portions of the display area except the light-transmitting area, but the number of the pixel circuits in the light-transmitting area is different from that in the portions of the display area except the light-transmitting area, thereby realizing the light transmission of the light-transmitting area. Alternatively, in a specific implementation, the pixel density of the light-transmitting area may be smaller than that of the portions of the display area except the light-transmitting area; or the number of pixels of the light-transmitting area is the same as that of the portions of the display area except the light-transmitting area, but the size of the pixels of the light-transmitting area is reduced. These schemes all can realize the light transmission of the light-transmitting area and belong to a protection scope of the present disclosure.

It should be noted that the light-transmitting area provided in the embodiment of the present disclosure may display an image. Alternatively, in a specific implementation, the light-transmitting area may only transmit light and does not display an image, that is, the light-transmitting area is formed as a transparent hole in which no driving circuit is provided, but the anodes, the light-emitting layers, the cathodes, the encapsulation layer, the polarizer, and the like are provided. In the scheme where the light-transmitting area is formed as the transparent hole in the display apparatus provided in the embodiment of the present disclosure, the polarizer is provided in the transparent hole, so that the Mura phenomenon may also occur, in a case where an outdoor scene is shot indoors after rainy weather. In this case, the scheme in the embodiment of the present disclosure where the complex refractive layer 400 is provided is used to eliminate the Mura phenomenon.

Figure 8:
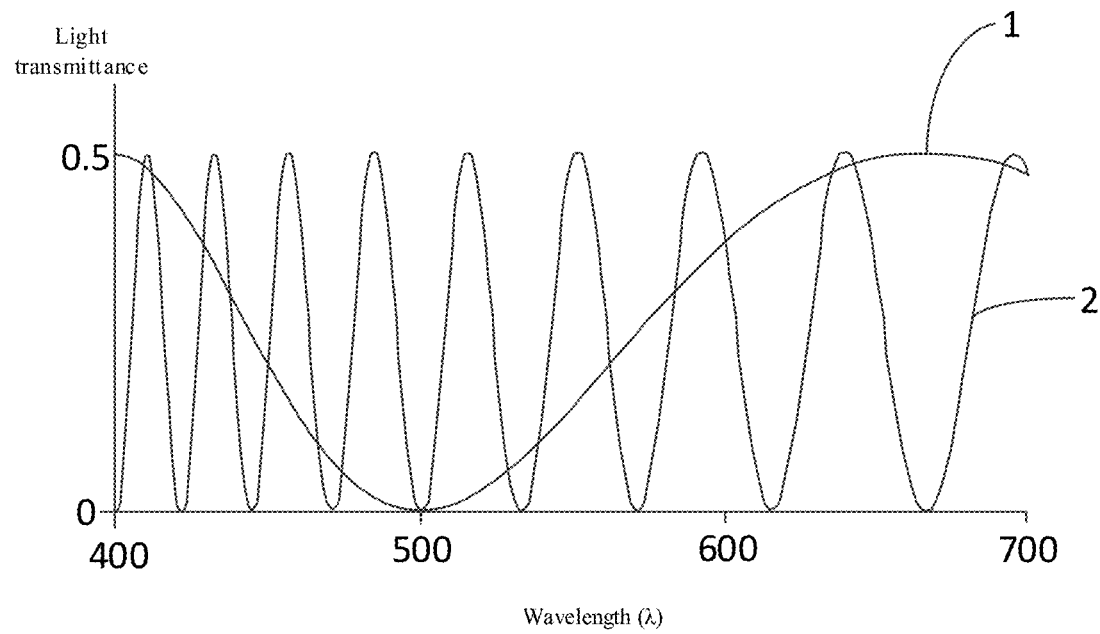
FIG. 8 is a schematic diagram of light transmittance of complex refractive layers with different phase difference values.

Specifically, a material of the complex refractive layer refers to a material with different refractive indexes in different directions, and the complex refractive layer may be formed by stretching a polymer material in a certain direction, and the polymer material commonly includes a polyethylene terephthalate (PET) film material, a super retarder film (SRF) film material, or the like. The complex refractive layer has a larger phase difference value. When the linearly polarized light passes through the complex refractive layer with the larger phase difference value, the linearly polarized light may be converted into the circularly polarized light. Moreover, whether the light in the full-wave band of the external visible light may pass through the complex refractive layer is related to the phase difference value (Re) of the complex refractive layer. As shown in FIG. 8, FIG. 8 shows the light transmittance of the complex refractive layers with different phase difference values (Re) through which the visible light (having a wavelength $\lambda$) in the full-wave band passes, and the formula is as follows: $I/I0=\frac{1}{2}\cdot\sin 2(\pi\cdot Re/\lambda)$, where I0 is an intensity of light before passing through the complex refractive layer, and I is an intensity of light after passing through the complex refractive layer. Curve 1 represents the light transmittance of the complex refractive layer with the phase difference value Re=800, and curve 2 represents the light transmittance of the complex refractive layer with the phase difference value Re=5000. It can be seen that the larger the phase difference value (Re) is, the more light is transmitted in the visible light band (that is, the greater the light intensity is). Therefore, the complex refractive layer having the larger phase difference value is preferable.

In a specific implementation, in the display apparatus provided in the embodiment of the present disclosure, the phase difference value of the complex refractive layer may be a value greater than or equal to 1000 and less than or equal to 20000. When the phase difference value of the complex refractive layer is the value greater than or equal to 1000 and less than or equal to 20000, more light in the visible light band is transmitted.

Figure 9:
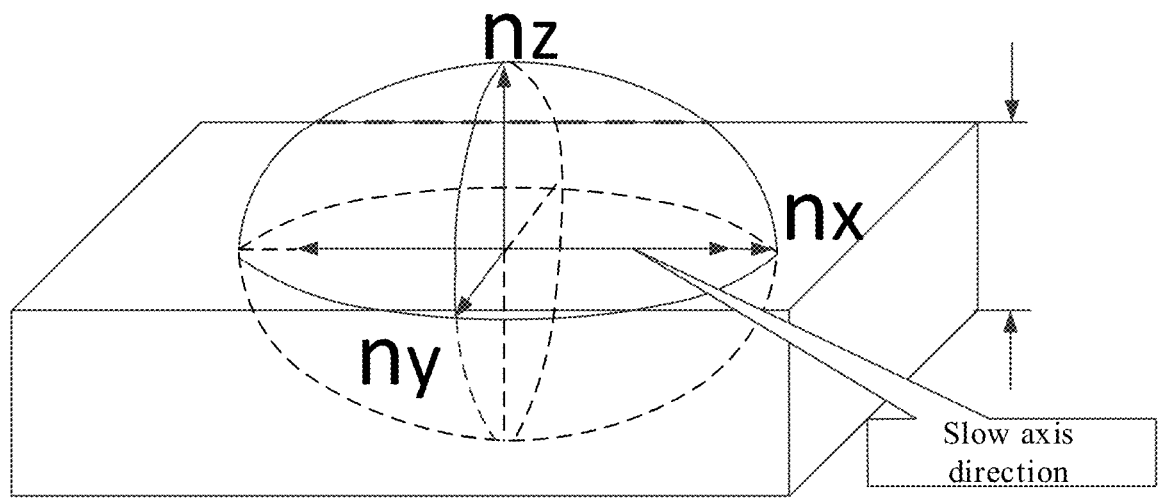
FIG. 9 is a schematic diagram illustrating refractive indices of a retardation film in various directions.

Specifically, the complex refractive layer is one kind of retardation film. After an alignment process (stretching) for a transparent polymer film, an arrangement direction of molecules of the transparent polymer film is concentrated toward an alignment direction, so that the refractive indexes of light in directions in the film are changed, and the film is called the retardation film. As shown in FIG. 9, it is generally defined that: a direction for the maximum refractive index in a surface of the film is a slow axis direction, and the refractive index in the direction is nx; a direction orthogonal to the slow axis direction in the surface of the film is a fast axis direction, and the refractive index in the direction is ny; the refractive index of the film in the vertical direction is nz. The phase difference value of the film is Re=(nx−ny)·d, it can be seen that the phase difference value Re of the complex refractive layer is related to a thickness d of the complex refractive layer, and the greater the thickness d is, the greater the phase difference value Re is.

In a specific implementation, the greater the thickness of the complex refractive layer is, the greater the phase difference value is, the more light is transmitted in the visible light band, i.e. the greater the intensity of the circularly polarized light converted from the linearly polarized light is. However, the current display apparatus tends to be light and thin, but the thickness of the complex refractive layer is larger, which is not beneficial to the lightness and thinness of the display apparatus. Therefore, in order to enable light in the visible light band to be transmitted as much as possible and to realize the lightness and thinness of the display apparatus, in the display apparatus provided in the embodiment of the present disclosure, the phase difference value of the complex refractive layer is a preset value, and the preset value is 5000. When the phase difference value of the complex refractive layer is 5000, more light in the visible light band can be transmitted, and the lightness and thinness of the display apparatus can be realized.

Figure 4:
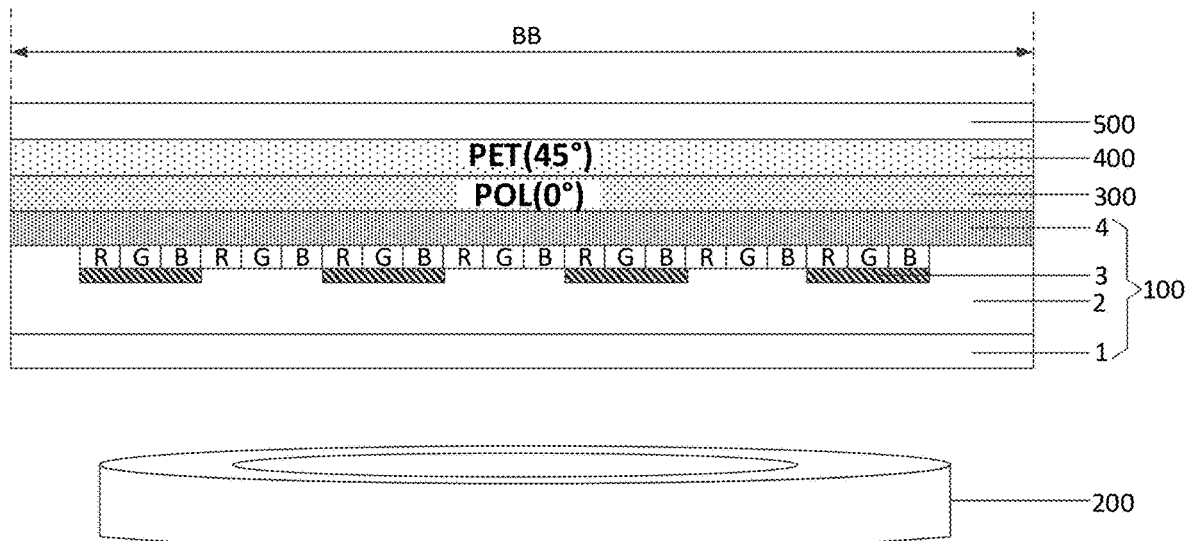
FIG. 4 is a schematic cross-sectional view of a display apparatus according to an embodiment of the present disclosure.
Figure 5:
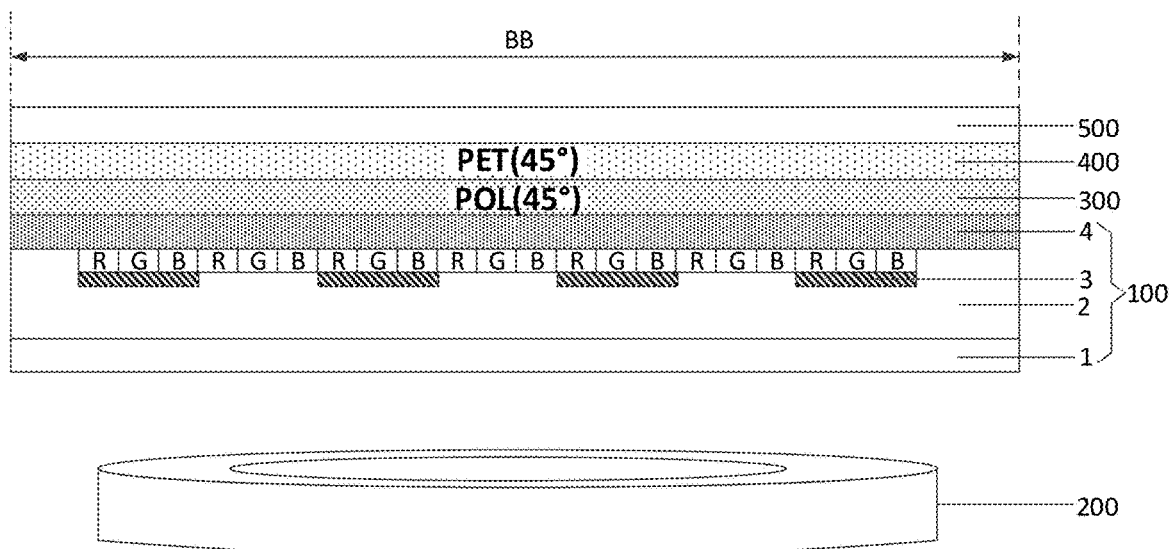
FIG. 5 is another schematic cross-sectional view of a display apparatus according to an embodiment of the present disclosure.
Figure 6:
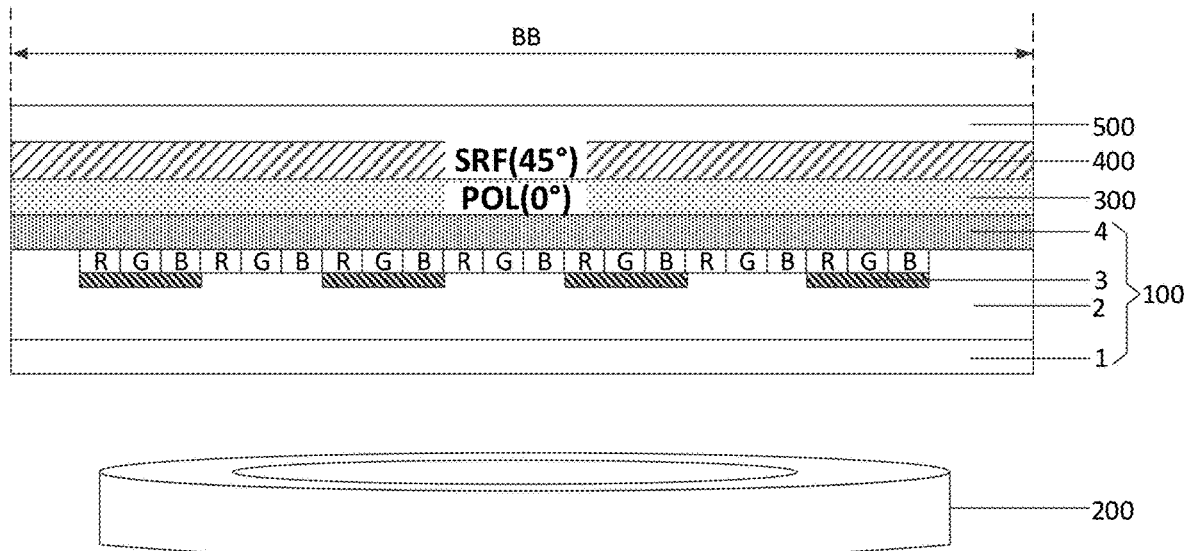
FIG. 6 is another schematic cross-sectional view of a display apparatus according to an embodiment of the present disclosure.
Figure 7:
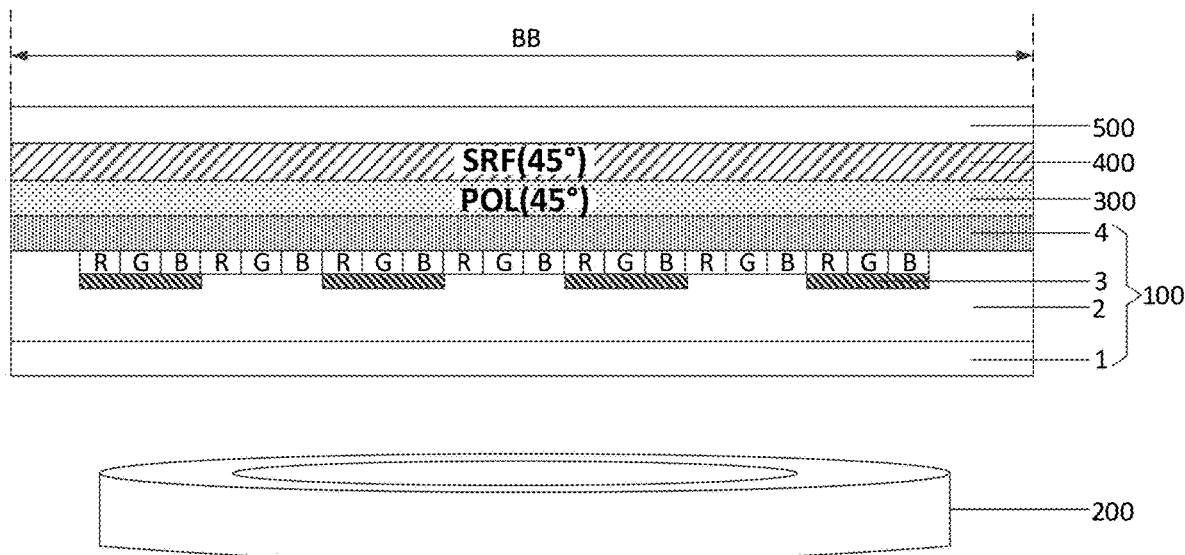
FIG. 7 is another schematic cross-sectional view of a display apparatus according to an embodiment of the present disclosure.

In a specific implementation, in the display apparatus provided in the embodiments of the present disclosure, the material of the complex refractive layer may be the PET or the SRF. Specifically, as shown in FIGS. 4 and 5, the material of the complex refractive layer is PET; as shown in FIGS. 6 and 7, the material of the complex refractive layer is SRF.

In a specific implementation, in the display apparatus provided in the embodiment of the present disclosure, when the material of the complex refractive layer is PET, the thickness of the complex refractive layer is in a range from 30 μm to 200 μm, to ensure that the PET has a sufficient phase difference value in a range from 1000 to 20000.

In a specific implementation, in order to achieve a light and thin display apparatus, in the display apparatus provided in the embodiment of the present disclosure, the thickness of the complex refractive layer is 50 μm.

In a specific implementation, in the display apparatus provided in the embodiment of the present disclosure, when the material of the complex refractive layer is SRF, since the phase difference value of the SRF material is usually not less than 8000, it is not necessary to control the thickness, and an SRF film with a certain thickness may be selected according to actual needs.

In a specific implementation, in order to improve the shooting quality of the camera-under-screen display apparatus, in the display apparatus according to the embodiment of the present disclosure, the included angle between the film-forming stretching direction of the complex refractive layer and the first direction may be in a range from 20° to 60°. When the included angle is in a range from 20° to 60°, part of circularly polarized light may pass through the polarizer.

Figure 10:
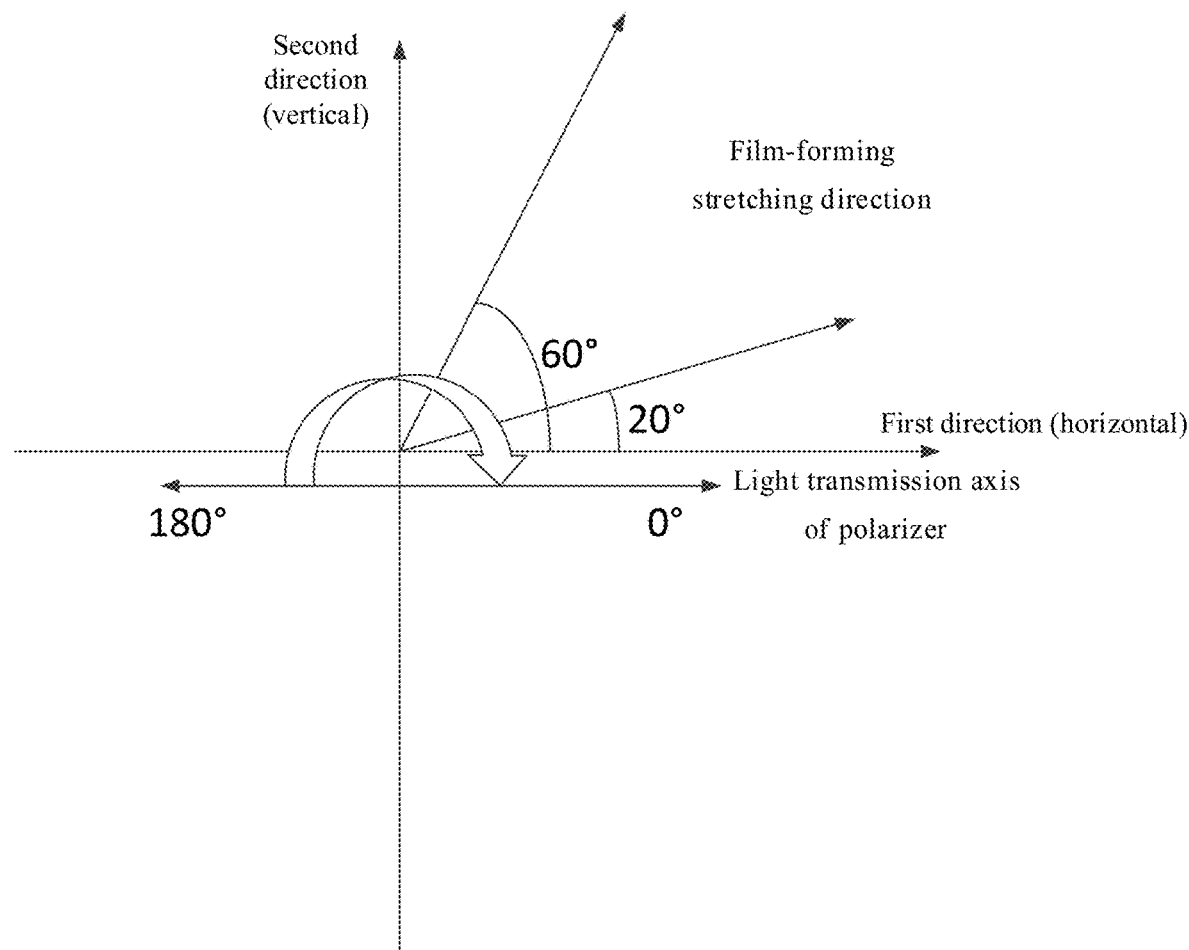
FIG. 10 is a schematic diagram illustrating an angle relationship among a film-forming stretching direction of a complex refractive layer, an extending direction of a light transmission axis of a polarizer, and a horizontal direction.

In a specific implementation, in the above display apparatus according to the embodiment of the present disclosure, as shown in FIG. 10, an included angle between an extending direction of a light transmission axis of the polarizer and the first direction (the horizontal direction) may be any angle between 0° and 180°.

In a specific implementation, in the display apparatus according to the embodiment of the present disclosure, as shown in FIG. 10, since the included angle between the film-forming stretching direction of the complex refractive layer and the first direction is in a range from 20° to 60°, an included angle between the film-forming stretching direction of the complex refractive layer and the extending direction of the light transmission axis of the polarizer is in a range from 0° to 160°.

In a specific implementation, in the display apparatus provided in the embodiment of the present disclosure, the included angle between the extending direction of the light transmission axis of the polarizer and the first direction (the horizontal direction) is generally 0° or 45°, and the included angle between the film-forming stretching direction of the complex refractive layer and the first direction is preferably 45°, so that the circularly polarized light may almost completely pass through the polarizer, and thus, the Mura phenomenon is effectively improved, as shown in FIGS. 4 and 5.

In a possible implementation, in the display apparatus provided in the embodiment of the present disclosure, as shown in FIG. 4 and FIG. 6, when the included angle between the film-forming stretching direction of the complex refractive layer 400 and the first direction is 45°, and the included angle between the extending direction of the light transmission axis of the polarizer 300 and the first direction is preferably 0°, the Mura phenomenon can be effectively eliminated.

In a possible implementation, in the display apparatus provided in the embodiment of the present disclosure, as shown in FIG. 5 and FIG. 7, when the included angle between the film-forming stretching direction of the complex refractive layer 400 and the first direction is 45°, and the included angle between the extending direction of the light transmission axis of the polarizer 300 and the first direction is preferably 45°, the Mura phenomenon can be effectively eliminated.

Figure 11:
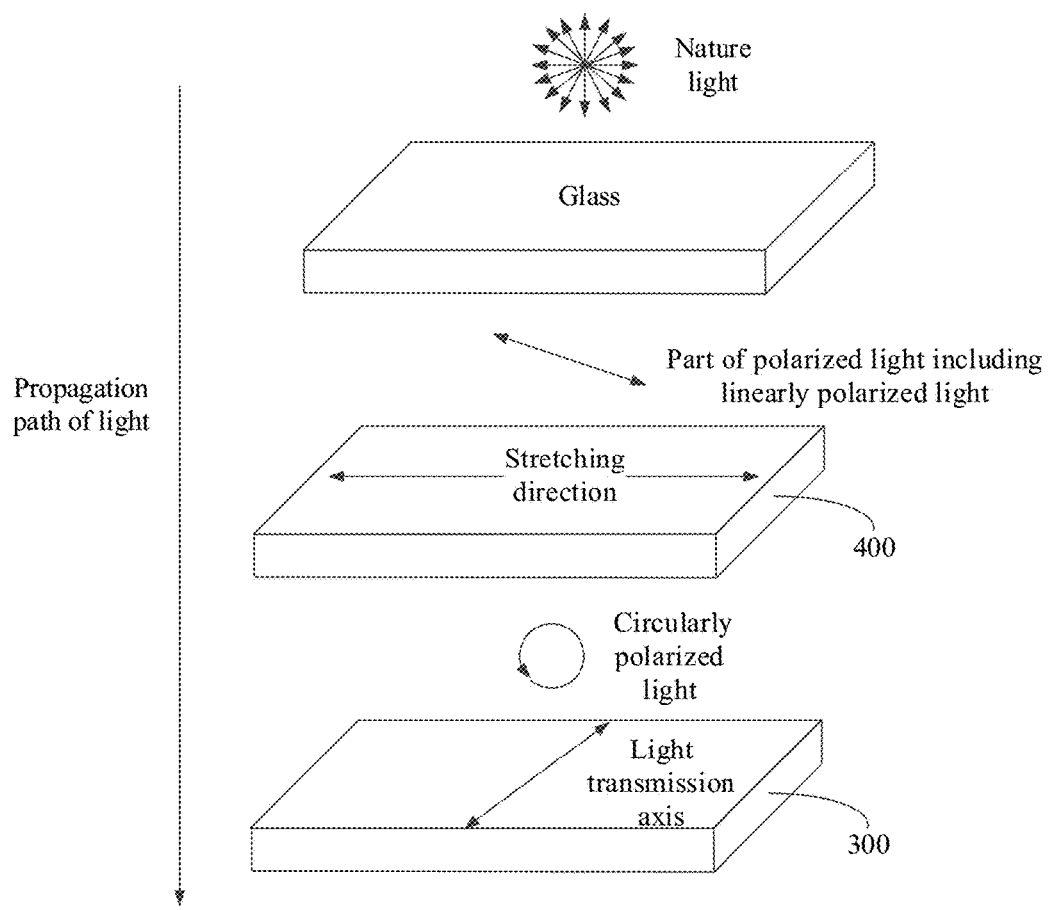
FIG. 11 is a schematic diagram illustrating a light propagation path according to an embodiment of the present disclosure.
Figure 12:
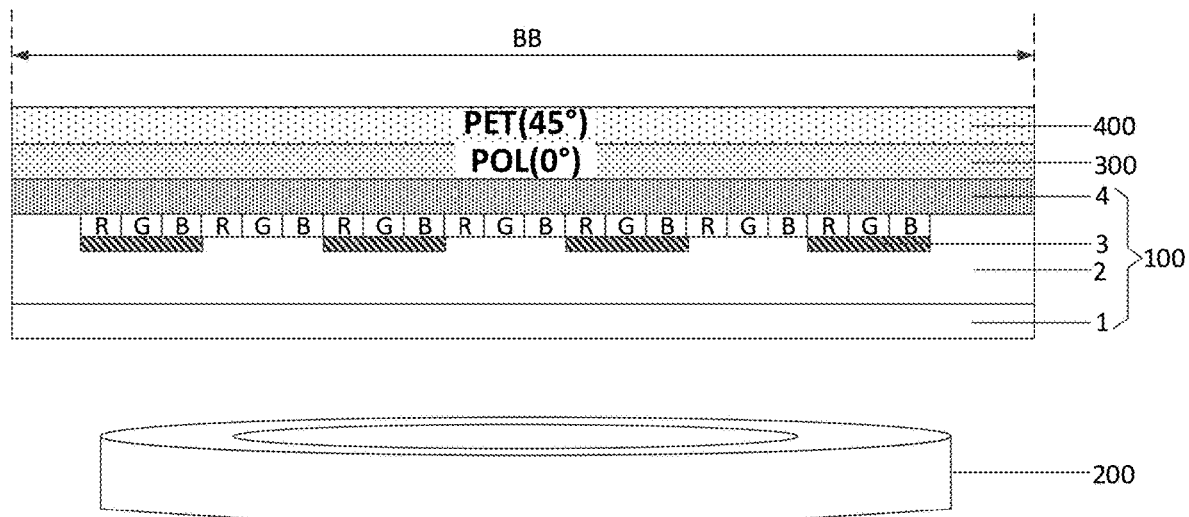
FIG. 12 is another schematic cross-sectional view of a display apparatus according to an embodiment of the present disclosure.
Figure 13:
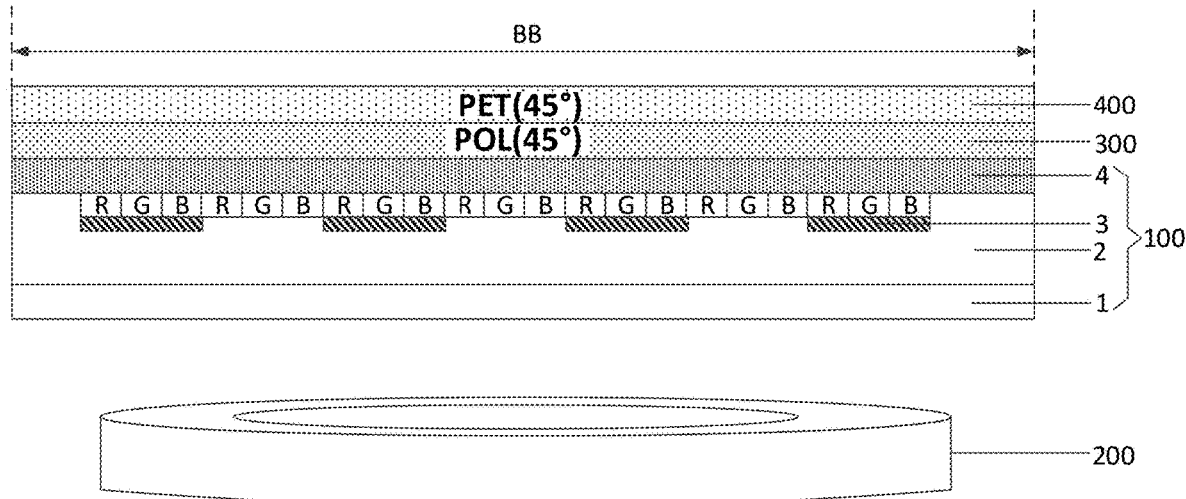
FIG. 13 is another schematic cross-sectional view of a display apparatus according to an embodiment of the present disclosure.
Figure 14:
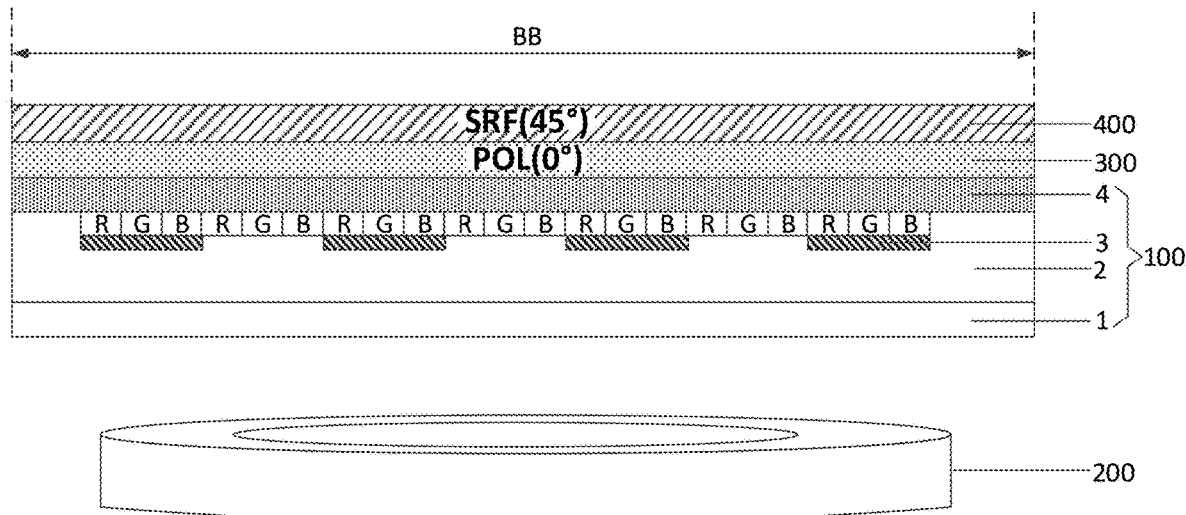
FIG. 14 is another schematic cross-sectional view of a display apparatus according to an embodiment of the present disclosure.
Figure 15:
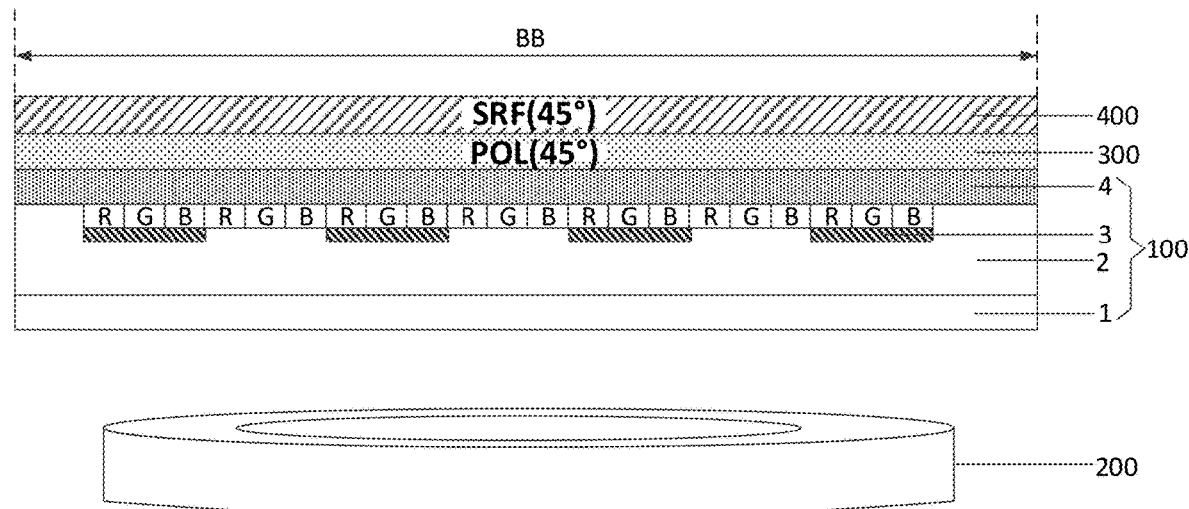
FIG. 15 is another schematic cross-sectional view of a display apparatus according to an embodiment of the present disclosure.

Specifically, FIG. 11 shows the light conversion principle in the embodiment of the present disclosure; when the external natural light passes through the window (glass) and is converted into the linearly polarized light, and the included angle between the film-forming stretching direction of the complex refractive layer 400 and the first direction is 45° (the extending direction of the trace of the dust is approximately perpendicular to the first direction), the linearly polarized light is converted into the circularly polarized light by the complex refractive layer 400, which in turn enters the camera.

It should be noted that according to the Fresnel formula, after the light is refracted, an energy of a P wave (vibration parallel to the incident surface) is greater than that of an S wave (vibration perpendicular to the incident surface), that is, the natural light is changed into the polarized light. However, the external natural light cannot be completely converted into the linearly polarized light after passing through the glass, as the external natural light passing through the glass includes a part of elliptically polarized light and most of the linearly polarized light.

In a specific implementation, since the camera is only disposed in the light-transmitting area, the complex refractive layer may be disposed only in the light-transmitting area, which may cause the display apparatus to be uneven. Therefore, in order to ensure the flatness of the display apparatus, in the display apparatus provided in the embodiment of the present disclosure, the complex refractive layer is arranged in a whole surface.

In a specific implementation, in the display apparatus provided in the embodiments of the present disclosure, as shown in FIGS. 4 to 7, the complex refractive layer 400 and the polarizer 300 may be bonded together by a pressure-sensitive adhesive (PSA) or an optical adhesive (OCA), which are not illustrated in the embodiments of the present disclosure.

In a specific implementation, as shown in FIG. 4 to FIG. 7, the display apparatus provided in the embodiment of the present disclosure further includes a cover plate 500 located on a side of the complex refractive layer 400 facing away from the electroluminescent display panel 100. Specifically, the cover plate 500 may be a glass cover plate or a plastic cover plate.

In a specific implementation, as shown in FIGS. 12 to 15, in the display apparatus provided in the embodiment of the present disclosure, the material and the film-forming stretching direction of the complex refractive layer 400 in FIGS. 12 to 15 correspond to the structures shown in FIGS. 4 to 7, respectively. A difference between the structures in FIGS. 12 to 15 and in FIGS. 4 to 7 is that the complex refractive layer 400 in the structure shown in FIGS. 12 to 15 also acts as the cover plate of the display apparatus. For example, in a foldable or rollable display apparatus, the complex refractive layer 400 may be further used as the cover plate of the display apparatus.

In a specific implementation, when the complex refractive layer is used as the cover plate, in the display apparatus provided in the embodiment of the present disclosure, as shown in FIG. 12 to FIG. 15, the complex refractive layer 400 needs to be hardened, and a hardness value of the complex refractive layer 400 is greater than or equal to 6H. In an embodiment, the entire layer of the complex refractive layer 400 may be hardened, or a part of the complex refractive layer 400 corresponding to the camera-under-screen display area may be hardened.

In addition, the display apparatus according to the embodiment of the present disclosure further includes a touch functional layer, which may be located between the electroluminescent display panel 100 and the polarizer 300.

Figure 16:
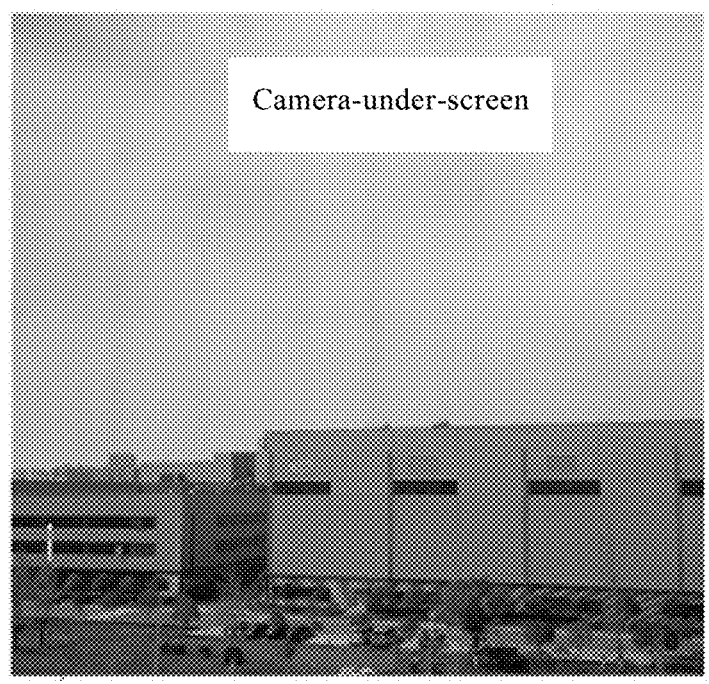
FIG. 16 is a photograph of an outdoor scene shot indoors by using a camera-under-screen display product without a complex refractive layer.
Figure 17:
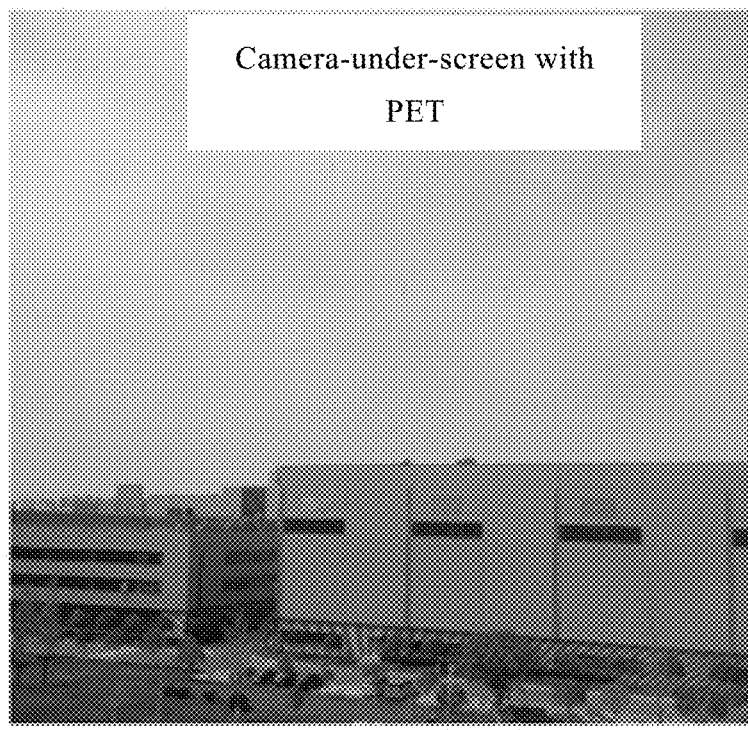
FIG. 17 is a photograph of an outdoor scene shot indoors by using a display apparatus according to an embodiment of the present disclosure.

Finally, in the sunny environment after rainy weather, when traces formed by the washing of rainwater on the glass window are not erased, the inventor of the present disclosure uses the display apparatus (e.g., a mobile phone) according to the embodiment of the present disclosure to take photographs of the same scene as that in FIGS. 2 and 3 indoors, as shown in FIGS. 16 and 17. FIG. 16 is a photograph shot by a camera-under-screen display product without a complex refractive layer; FIG. 17 is a real-shot effect diagram of a photograph shot by a camera-under-screen display product with a complex refractive layer (PET) disposed outside a polarizer (POL) of the camera-under-screen display apparatus. It can be seen that stripes (Mura phenomenon) on the window are completely disappeared in FIG. 17. Therefore, the display apparatus according to the embodiment of the present disclosure can improve the quality of the camera-under-screen.

Figure 18:
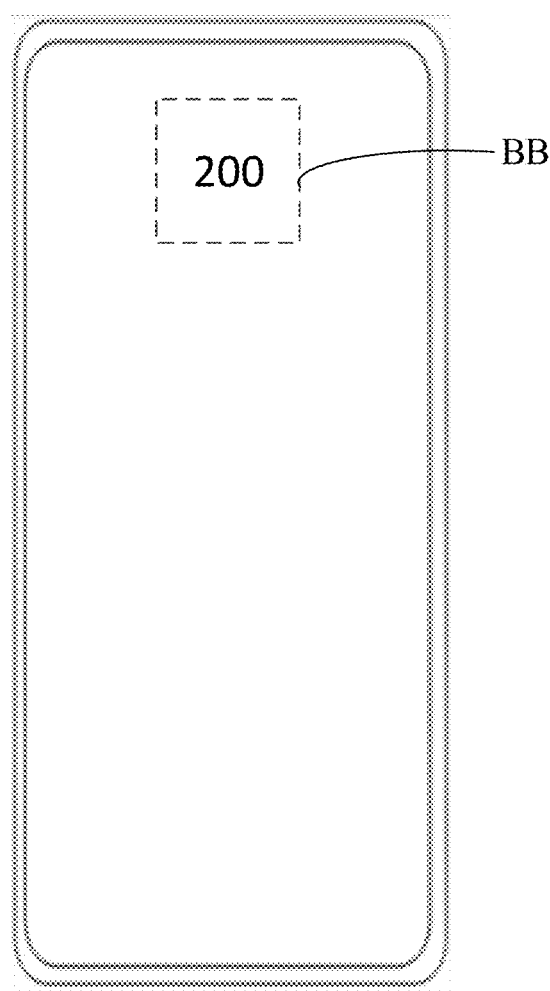
FIG. 18 is a schematic top view of a display apparatus according to an embodiment of the present disclosure.

In a specific implementation, the display apparatus provided in the embodiment of the present disclosure may be a full screen mobile phone as shown in FIG. 18, where the dashed-line frame represents the light-transmitting area BB in which the camera 200 is mounted, which is only schematically illustrated in FIG. 18, and is not limited to this. Alternatively, the display apparatus may be: any product or component with a display function, such as a tablet computer, a television, a display, a notebook computer, a digital photo frame, a navigator or the like. Other essential components of the display apparatus are understood by one of ordinary skill in the art to be provided, and are not described herein and should they be construed as limiting the present disclosure.

By taking the sunny environment after rainy weather as an example, when a user uses the display apparatus according to the embodiment of the present disclosure to shoot outdoor scenes through the glass (such as the window) indoors, dust exists on a surface of the outdoor glass window, so that when rainwater strikes the glass window, traces are formed by the washing of rainwater on the glass window. Refractive indexes of the glass window and dust are different, so that outdoor natural light passes through the glass window to enter indoors and is refracted to form a linearly polarized light. After the glass window is washed by rainwater, some portions of the glass window are clean (i.e., without dust), but dust still exists in the other portions, so that the linearly polarized light which is refracted through the different portions of the glass window and enters indoors has different polarization states. If the linearly polarized light directly enters the polarizer at this time, the linearly polarized light in some areas may be absorbed by the polarizer, which results in the uneven brightness in the image (Mura phenomenon). According to the present disclosure, the complex refractive layer is disposed on the side of the polarizer facing away from the electroluminescent display panel, and configured to convert the linearly polarized light into the circularly polarized light, so that the linearly polarized light in the different polarization states enters the complex refractive layer and then enters the polarizer, the complex refractive layer converts the linearly polarized light into the circularly polarized light, when the included angle between the film-forming stretching direction of the complex refractive layer and the first direction is an acute angle, almost all of the circularly polarized light may pass through the polarizer, and then the Mura phenomenon disappears.

It will be apparent to one of ordinary skill in the art that various changes and modifications may be made to the present disclosure without departing from the spirit and scope of the present disclosure. Thus, if such changes and modifications to the present disclosure fall within the scope of the claims and their equivalents of the present disclosure, the present disclosure is intended to encompass such changes and modifications.

What is claimed is:

1. A display apparatus, comprising:
an electroluminescent display panel having a display area, wherein the display area comprises a light-transmitting area; the electroluminescent display panel comprises a gate line extending along a first direction and a data line extending along a second direction;
a camera on a back side of the electroluminescent display panel, wherein an orthographic projection of the camera on the electroluminescent display panel is in the light-transmitting area;
a polarizer on a light outgoing side of the electroluminescent display panel, the polarizer being disposed in the entire display area; and
a complex refractive layer on a side of the polarizer facing away from the electroluminescent display panel;
wherein the complex refractive layer is configured to convert linearly polarized light from a side of the complex refractive layer facing away from the polarizer into circularly polarized light so that the circularly polarized light enters the polarizer; and
an included angle between a film-forming stretching direction of the complex refractive layer and the first direction is an acute angle.

2. The display apparatus of claim 1, wherein the acute angle is in a range from 20° to 60°.

3. The display apparatus of claim 2, wherein an included angle between an extending direction of a light transmission axis of the polarizer and the first direction is in a range from 0° to 180°.

4. The display apparatus of claim 2, wherein an included angle between the film-forming stretching direction of the complex refractive layer and an extending direction of a light transmission axis of the polarizer is in a range from 0° to 160°.

5. The display apparatus of claim 2, wherein the acute angle is 45°.

6. The display apparatus of claim 1, wherein a phase difference value of the complex refractive layer is in a range from 1000 nm to 20000 nm.

7. The display apparatus of claim 6, wherein the phase difference value of the complex refractive layer is 5000 nm.

8. The display apparatus of claim 1, wherein a material of the complex refractive layer is a polyethylene terephthalate or a super retarder film.

9. The display apparatus of claim 7, wherein a material of the complex refractive layer is a polyethylene terephthalate; and
a thickness of the complex refractive layer is in a range from 30 μm to 200 μm.

10. The display apparatus of claim 9, wherein the thickness of the complex refractive layer is 50 μm.

11. The display apparatus of claim 1, wherein the complex refractive layer is arranged in a whole surface.

12. The display apparatus of claim 1, wherein the complex refractive layer and the polarizer are bonded together by a pressure-sensitive adhesive or an optical adhesive.

13. The display apparatus of claim 1, further comprising a cover plate on a side of the complex refractive layer facing away from the electroluminescent display panel.

14. The display apparatus of claim 1, wherein the complex refractive layer is also used as a cover plate of the display apparatus.

15. The display apparatus of claim 14, wherein a hardness value of the complex refractive layer is greater than or equal to 6H.

16. The display apparatus of claim 15, wherein a hardness value of at least a portion of the complex refractive layer corresponding to the light-transmitting area is greater than or equal to 6H.

17. The display apparatus of claim 1, further comprising a touch functional layer between the electroluminescent display panel and the polarizer.

18. The display apparatus of claim 1, wherein the electroluminescent display panel comprises:
   a substrate;
   driving circuits on a side of the substrate facing the polarizer;
   light-emitting pixels on a side of the driving circuits facing the polarizer; and
   an encapsulation layer on a side of the light-emitting pixels facing the polarizer; and
   wherein a distribution density of the driving circuits in the light-transmitting area is less than a distribution density of the driving circuits in a non-light-transmitting area.

19. The display apparatus of claim 18, wherein a distribution density of the light-emitting pixels in the light-transmitting area is equal to a distribution density of the light-emitting pixels in the non-light-transmitting area.

* * * * *